United States Patent [19]
Tosuntikool et al.

[11] 4,053,797
[45] Oct. 11, 1977

[54] RECEIVE AMPLIFIER FOR PAM SIGNALS

[75] Inventors: Nam Tosuntikool, Belmont; Gregor D. McGibbon, San Carlos, both of Calif.

[73] Assignee: GTE Automatic Electric Laboratories Incorporated, Northlake, Ill.

[21] Appl. No.: 719,531

[22] Filed: Sept. 1, 1976

[51] Int. Cl.² .................. H03K 5/00; H03K 9/02; H03F 1/02
[52] U.S. Cl. .................. 307/262; 328/162; 330/9; 330/86
[58] Field of Search .................. 307/261, 262, 264; 330/9, 51, 86; 328/162, 165; 329/109

[56] References Cited
U.S. PATENT DOCUMENTS

| | | | |
|---|---|---|---|
| 3,631,355 | 12/1971 | Vail | 307/242 X |
| 3,944,852 | 3/1976 | Gilbert | 307/251 X |
| 3,970,868 | 7/1976 | Clements et al. | 307/232 |

*Primary Examiner*—John Zazworsky
*Attorney, Agent, or Firm*—Russell A. Cannon; Leonard R. Cool

[57] ABSTRACT

A decoded PAM input signal is coupled through a first polarity switch (which for one polarity of a polarity signal is closed) to the positive input line of a differential operational amplifier and through the series combination of a second polarity switch (which is open for the one polarity) and an input resistor to the negative input line of the differential amplifier. The positive input line is resistively connected to ground through a first bias resistor and is also connected to ground through the series combination of a second bias resistor and a third polarity switch which is also open for the one polarity. A feedback resistor is connected between the output line and the negative input line of the amplifier. By proper selection of resistances, this circuit provides a prescribed amplification of an input signal and changes its polarity as a function of a digital polarity signal that is applied to the switches, the circuit providing no change in output signal for a change in polarity signal when the input signal is of zero amplitude.

12 Claims, 4 Drawing Figures

(A POSITION)

(B POSITION)

RECEIVE AMPLIFIER FOR PAM SIGNALS

BACKGROUND OF INVENTION

This invention relates to amplifiers, and more particularly to an amplifier that is responsive to received decoded pulse amplitude modulation (PAM) input and polarity signals for restoring polarity information to the received PAM signals so as to reconstruct a sampled input signal.

In digital voice-frequency-type transmission systems, analog signals are sampled at a prescribed rate to produce pulse signal samples having amplitudes that are coded for transmission, polarity information related to individual sample pulses being contained in a polarity signal. Received PAM signals are decoded and combined with the polarity signal to reproduce the original sampled signal. A prior-art amplifier for combining decoded PAM signals with a polarity signal employs a first noninverting amplifier having its output connected through a first switch to a summing input to a second noninverting amplifier, the output of the first amplifier also being inverted by a third amplifier which has its output connected through a second switch to the summing input of the second amplifier. The two switches are controlled by the polarity signal for closing only one switch at a time, for controlling whether the amplitude of the reproduced signal is positive or negative. This prior-art amplifier circuit is relatively expensive since it employs a large number of components. Also, both of the input amplifiers there may introduce offset and thereby cause distortion. Another prior-art amplifier circuit for performing the same function comprises a first noninverting operational amplifier having its output resistively connected to the two differential input lines of a second operational amplifier which has one input line also connected to a reference voltage and resistively connected through a polarity switch to ground. The switch is opened and closed in response to the polarity signal for controlling the polarity of the reproduced signal. When the switch is open, the differential amplifier operates as a voltage follower, and the output voltage is equal to the input voltage. When the switch is closed, the one input line of the differential amplifier is grounded so that the output is inverted from the input. The input impedance in this latter prior-art amplifier circuit may vary when the polarity switch changes states. This causes an offset voltage in the differential amplifier (i.e., $V_{out} \neq 0$ when $V_{in} = 0$), which is undesirable. It is preferable that the output voltage of such an amplifier circuit remain at a 0 volt reference level when the input voltage is 0 volts for several switching cycles of the polarity signal.

An object of this invention is the provision of an improved cost-reduced PAM amplifier circuit having essentially zero offset.

SUMMARY OF INVENTION

In accordance with this invention, one input line of a differential operational amplifier is connected through a first polarity switch to a source of PAM signals, through a first resistor to a ground reference potential, and through the series combination of a second resistor and a second polarity switch to the reference potential. The other input line of the differential amplifier is connected through the series combination of a third resistor and a third polarity switch to the source of PAM signals and through a fourth resistor, which is a feedback resistor, to the output line thereof. This circuit is caused to have a substantially zero offset voltage by requiring that the resistance of the second resistor be substantially twice the resistances of the first, third, and fourth resistors, which are the same values.

DESCRIPTION OF DRAWING

This invention will be more fully understood from the following detailed description of a preferred embodiment thereof, together with the attached drawing in which.

DESCRIPTION OF PREFERRED EMBODIMENTS

Figure 1:
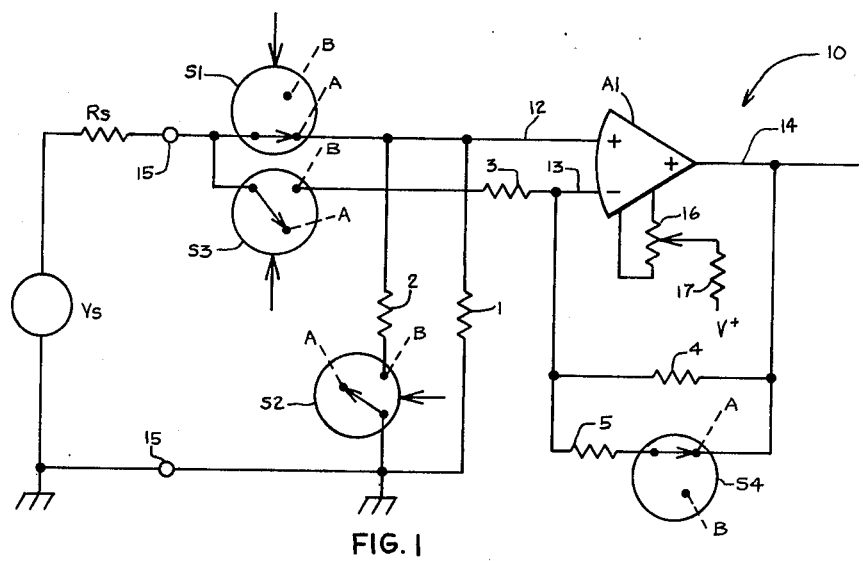
FIG. 1 is a schematic circuit diagram of a preferred embodiment of this invention.

Referring now to FIG. 1, a PAM amplifier circuit 10 embodying this invention comprises a differential input amplifier A1 which may be an operational amplifier, a plurality of resistors 1 – 5, inclusive, and a plurality of polarity switches S1 – S4, inclusive. The amplifier has high gain and low input bias current. The circuit 10 has an input port 15 that is essentially connected to a source $V_s$ of decoded PAM signals having a source resistance Rs. The positive input line 12 of A1 is connected through polarity switch S1 to the source resistance Rs, through bias resistor 1 to ground and through the series combination of a second bias resistor 2 and polarity switch S2 to ground. The negative input line 13 of A1 is connected through the series combination of the input resistor 3 and polarity switch S3 to the source resistance Rs, through the feedback resistor 4 to the output line 14, and through the series combination of a second feedback resistor 5 and polarity switch S4 to the output line 14. Terminals of A1 are also connected to supply voltages in the conventional manner.

The amplifier A1 line is assumed to be an operational amplifier having zero offset voltage as well as a low output impedance, a high input impedance, and a high voltage gain, although the amplifier circuit 10 with input and feedback resistors 3 and 4, respectively, is selected in this case to have a unity voltage gain. Zero offset voltage means that the output voltage of A1 is zero when the input-difference voltage to A1 is zero. This is particularly desirable in order to minimize distortion in the reproduced signal on line 14. If the internal design of the operational amplifier A1 does not provide zero offset voltage, the offset voltage on A1 may be nulled by adjusting the potentiometer 16. In practice, the bias currents $I_{12}$ and $I_{13}$ have finite non-zero values which can cause a non-zero offset voltage for the circuit. Proper selection of the values of the resistances R1 – R5 of associated resistors causes the circuit 10 to also have zero offset voltage.

Figure 2:
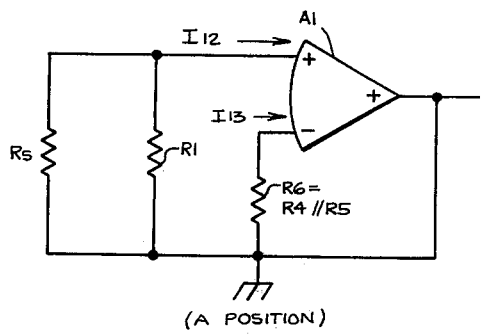
FIG. 2 is an equivalent circuit of the circuit configuration in FIG. 1, with the switches in the A position.
Figure 3:
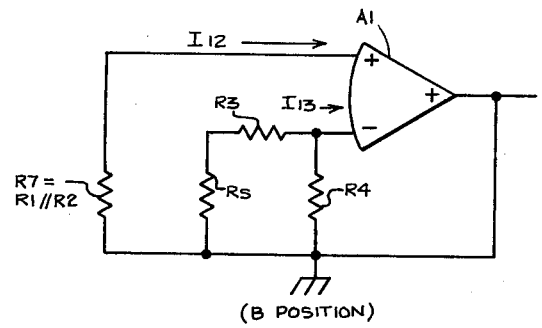
FIG. 3 is an equivalent circuit of the circuit configuration in FIG. 1, with the switches in the B position.

The input impedances of circuit 10, when the polarity switches are in the A positions and B position, are the resistances R1 and R3, respectively. The output voltage $V_{14}$ of A1 is, of course, representable as $$V_{14} = k(V_{12} - V_{13}) \tag{1}$$

$$= k(I_{13}R13 - I_{12}R12) \quad (2)$$

where $k$ is the gain of amplifier circuit 10; $V_{12} = -I_{12}R12$ and $V_{13} = -I_{13}R13$ and are the input voltages on lines 12 and 13 with respect to ground, respectively; $I_{12}$ and $I_{13}$ are the currents in lines 12 and 13, respectively; and R12 and R13 are the impedances between ground and the lines 12 and 13, respectively. Thus, where R12 = R13 and $I_{12} = I_{13}$, the output voltage of circuit 10 will be zero for zero input voltage (i.e., for $V_s = 0$). The equivalents of circuit 10 for the polarity switches in the A and B positions are shown in FIGS. 2 and 3, respectively. It is desirable that the resistances R1 - R5 of associated resistors have values here which make the net resistances R12 and R13 in equation (2) the same values.

In FIG. 2, the currents $I_{12}$ and $I_{13}$ are the same values, where the polarity switches are in the A positions, if $$R6 = R1 \,||\, Rs \quad (3)$$

where $$R6 = R4 \,||\, R5 \quad (4)$$

which means, of course, that $$R6 < R1. \quad (5)$$

In FIG. 3, the currents $I_{12}$ and $I_{13}$ are the same values, where the polarity switches are in the B positions, if $$R7 = (R3 + Rs) \,||\, R4 \quad (6)$$

where $$R7 = R1 \,||\, R2 \quad (7)$$

which means, of course, that $$R7 < R4. \quad (8)$$

Since the amplifier circuit 10 including A1 has a gain $k = 1 = R4/R3$, then $$R3 = R4 \quad (9)$$

for the polarity switches in the B positions. Since the output impedance Rs of the source voltage $V_s$ is finite (not equal to zero), it is necessary that the input impedances of the circuit 10 for the polarity switches in the A and B positions be the same values. This means that $$R1 = R3 = R4 = R, \quad (10)$$

where $R$ is some fixed value of resistance. It is now clear from equations (3), (4), and (10) that $$Rs = R5. \quad (11)$$

Assuming now that the source resistance Rs is also equal to the resistance R, which has been found to be a reasonable assumption, then $$R = R1 = R3 = R4 = R5 = Rs. \quad (12)$$

Finally, from equations (6), (7), and (12), it is also now clear that $$R2 = 2R. \quad (13)$$

Thus, for resistances satisfying the requirements of equations (12) and (13), the offset voltage of the circuit 10 is zero volts, as is desired. Further, since the current in the feedback loops of A1 is very low (e.g., less than 500 nanoamperes, max.), the feedback path containing resistor 5 and switch S4 may be replaced by an open circuit without seriously affecting the operation of the amplifier circuit 10.

Figure 4:
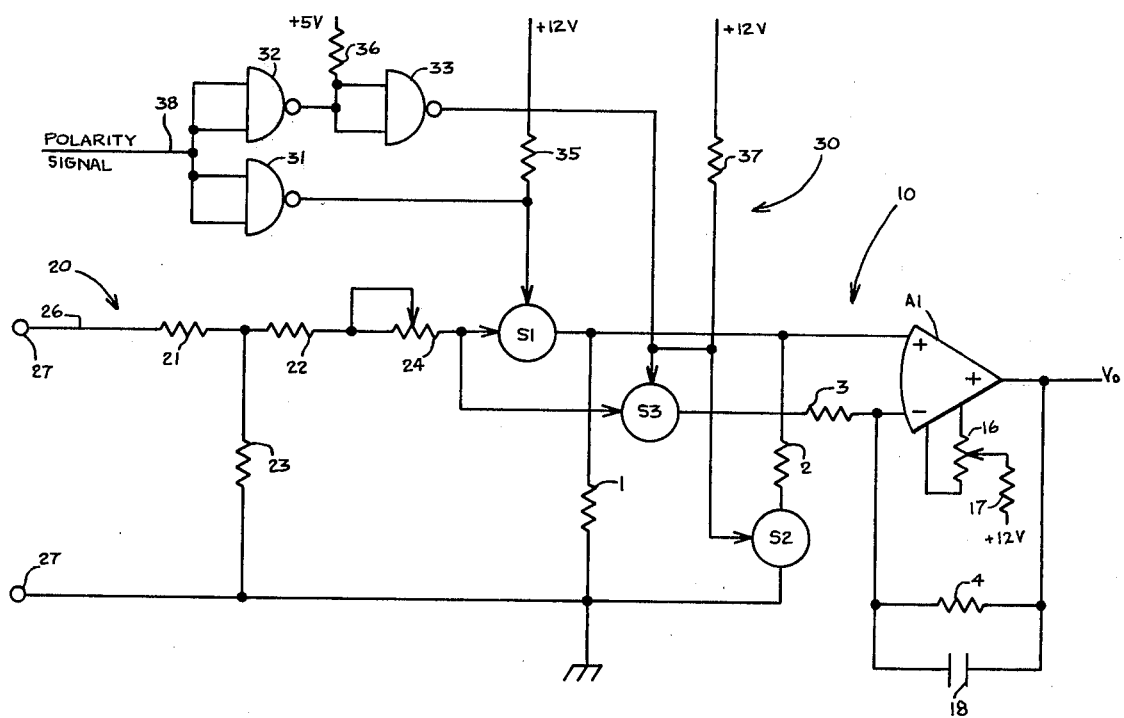
FIG. 4 is a schematic circuit diagram of a PAM receive amplifier embodying this invention that was built and operated.

A circuit 10 embodying this invention which was built and successfully operated is shown in FIG. 4. It included the circuit 10, a resistive pad 20, and a switching circuit 30. In this circuit arrangement, A1 was an LM 318 differential amplifier, manufactured by National Semiconductor. The resistors 1, 3, and 4 were 1% resistors whereas resistor 2 was a 10% resistor. The resistances of resistors 1, 3, and 4 here were 5.11 kohms. The resistance R2 was 9.8 kohms, rather than 10.22 kohms, since resistors having the former resistance value are commercially available. This change in the resistance R2 did not adversely affect the operation of this circuit. A capacitor 18 was connected across feedback resistor 4 to stabilize the amplifier circuit. The switches S1 - S3 were elements of a CD 4016 COS/-MOS quad bilateral switch, manufactured by RCA. The switches have very low leakage current and resistances that are very low and are preferably the same values. This occurs here where the switches are manufactured on the same chip.

The input pad 20 comprised the series resistors 21 and 22 and the shunt resistor 23. A variable resistor 24 was connected between the pad 20 and the inputs to switches S1 and S3 of circuit 10. The resistances of resistors 21 - 23 are selected to match the actual source impedance Rs' in series with line 26 to the input impedance (5.11 kohms here) of circuit 10. In this arrangement, R21 = 686 ohms, R22 = 3.65 kohms, R23 = 1.527 kohms, and R24 = 500 ohms, for Rs' = 1 kohm. The variable resistor 24 had a maximum resistance of 500 ohms and was adjusted to compensate for any change in loss of the pad 20 by resistances introduced by the switches, which may be between 200 and 400 ohms.

The switching circuit 30 comprised NAND-gates 31, 32, and 33 and the resistors 35, 36, and 37. The polarity signal on line 38 was applied to the inputs to gates 31 and 32. The output of gate 31 was applied to an S1 input which was connected through bias resistor 35 to a positive supply voltage. The output of gate 32 was applied to the inputs of gate 33, which were connected through bias resistor 36 to a positive supply voltage. Finally, the output of gate 33 was applied to S2 and S3 inputs which were connected through bias resistor 37 to a positive supply voltage. When the polarity signal is low, indicating one polarity, then the output of gate 31 is high and closes switch S1 such that it is in the A position in FIG. 1. The high output of gate 32 is inverted by the gate 33 to keep S2 and S3 open during the time interval that the polarity signal is low. Conversely, when the polarity signal goes high, indicating the other polarity, the low output of gate 31 opens switch S1. The low output voltage of gate 32 is inverted by gate 33, which produces a high signal level to close the switches S2 and S3 such that they are in the B position indicated in FIG. 1.

What is claimed is:

1. Apparatus for converting an input train of amplitude-varying pulses of one polarity to an output pulse train having a polarity as a function of a polarity signal which is associated with the input pulse train and has first and second amplitude levels corresponding to one and other polarities of output pulses, comprising:
  first and second reference points;
  first, second, third, and fourth resistors;
  first, second, and third switch means;
  a differential-input operational amplifier having a first input terminal connected through said first switch means to said first reference point, connected through said first resistor to said second reference point, and connected through the series combination of said second resistor and said second switch means to said second point, and having a second input terminal electrically connected through the series combination of said third resistor, which is an input resistor, and said third switch means to said first point and connected through said fourth resistor, which is a feedback resistor, to an output terminal of said amplifier; and
  control means responsive to the polarity signal for closing said first switch means and opening said second and third switch means in response to a polarity signal of the first level, and for opening said first switch means and closing said second and third switch means in response to a polarity signal of the second level.

2. Apparatus according to claim 1 wherein the resistances of said first, third, and fourth resistors are approximately the same values and wherein the resistance of said second resistor is approximately twice that of said other resistors.

3. Apparatus according to claim 2 including the series combination of a fifth resistor, which is a feedback resistor, and fourth switch means electrically connected between said second input terminal and said output terminal of said amplifier; said fourth switch means being responsive to said control means for being closed and opened in response to a polarity signal of the first and second levels, respectively.

4. Apparatus according to claim 3 wherein the resistance of said fifth resistor is approximately equal to that of said fourth resistor.

5. Apparatus according to claim 2 including a capacitor connected in parallel with said fourth resistor for frequency compensation.

6. Apparatus according to claim 2 including a variable resistor electrically connected between said first point and a resistive pad comprising fifth and sixth resistors electrically connected in series with said variable resistor and a seventh resistor electrically connected between the junction of said fifth and sixth resistors and said second point, said fifth, sixth, and seventh resistors having values of resistance for matching the input impedance of said circuit elements connected across said first and second points to the impedance of other circuit elements connected across the series combination of said sixth and seventh resistors.

7. Apparatus according to claim 6 wherein said control means comprises a first NAND-gate having a pair of inputs receiving the polarity signal and having an output applied to said first switch means for controlling the operation thereof, and a second NAND-gate having a pair of inputs receiving the polarity signal and having an output applied to the pair of inputs of a third NAND-gate having the output thereof applied to said second and third switch means for controlling the operation thereof.

8. A circuit responsive to input signals which are decoded PAM pulses of only one polarity and an associated polarity signal which has first and second amplitude levels corresponding to first and second polarities of reproduced sampled PAM pulses of both positive and negative polarities in the circuit output signal whose amplitude remains substantially unchanged where the polarity signal changes amplitude during receipt of a plurality of input PAM pulses of zero amplitude, comprising:
  a differential-input amplifier having first and second input lines and at least one output line;
  first switch means electrically connected in series between said first input line and a first reference point;
  a first resistor electrically connected in series between said first line and a second reference point;
  a second resistor and second switch means electrically connected in series between said first line and said second point;
  a third resistor and third switch means electrically connected in series between said second input line and said first point;
  a fourth resistor, which is a feedback resistor, electrically connected between said second input line and an output line of said amplifier; and
  control means responsive to the polarity signal for closing said first switch means and opening said second and third switch means in response to a polarity signal of the first level, and opening said first switch means and closing said second and third switch means in response to a polarity signal of the second level.

9. The circuit according to claim 8 wherein said amplifier is an operational amplifier.

10. The circuit according to claim 9 wherein the resistances of said first, third, and fourth resistors are substantially the same values and the resistance of said second resistor is approximately twice that of said other resistors.

11. The circuit according to claim 10 including a capacitor electrically connected across said fourth resistor for frequency compensation.

12. The circuit according to claim 10 including a fifth resistor and fourth switch means electrically connected in series across said fourth resistor, the resistances of said fourth and fifth resistors being substantially the same values, said control means causing said fourth switch means to be closed and opened in response to a polarity signal of the first and second levels, respectively.

* * * * *